(12) United States Patent
Byun et al.

(10) Patent No.: US 8,759,967 B2
(45) Date of Patent: *Jun. 24, 2014

(54) SEMICONDUCTOR PACKAGE AND PACKAGE ON PACKAGE HAVING THE SAME

(71) Applicant: Samsung Electronics Co., Ltd., Gyeonggi-do (KR)

(72) Inventors: Hak-Kyoon Byun, Hwaseong-si (KR); Dae-Young Choi, Yeosu-si (KR); Mi-Yeon Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/013,238

(22) Filed: Aug. 29, 2013

(65) Prior Publication Data

US 2014/0001649 A1    Jan. 2, 2014

Related U.S. Application Data

(63) Continuation of application No. 13/244,506, filed on Sep. 25, 2011, now Pat. No. 8,531,034.

(30) Foreign Application Priority Data

Dec. 21, 2010    (KR) .................. 10-2010-0131508

(51) Int. Cl.
*H01L 23/02*    (2006.01)
*H01L 23/48*    (2006.01)

(52) U.S. Cl.
USPC ................... 257/693; 257/686; 257/E25.006; 257/E25.021; 257/E25.027; 257/E23.085

(58) Field of Classification Search
USPC ................. 257/686, 693, E25.006, E25.013, 257/E25.021, E25.027, E23.085, 698, 778
See application file for complete search history.

(56) References Cited

U.S. PATENT DOCUMENTS

| 2,798,057 | A1 | 9/2004 | Bolkin et al. |
| 7,067,911 | B1 | 6/2006 | Lin et al. |
| 7,671,457 | B1 | 3/2010 | Hiner et al. |
| 7,851,894 | B1 | 12/2010 | Scanlon |
| 8,525,318 | B1* | 9/2013 | Kim et al. ...................... 257/686 |
| 8,531,032 | B2* | 9/2013 | Yu et al. ......................... 257/738 |

FOREIGN PATENT DOCUMENTS

| JP | 2008-166373 A | 7/2008 |
| JP | 2010-135671 A | 6/2010 |
| KR | 10-2009-0118159 A | 11/2009 |

* cited by examiner

*Primary Examiner* — Jasmine Clark
(74) *Attorney, Agent, or Firm* — Sughrue Mion, PLLC

(57) ABSTRACT

A semiconductor package and a package on package are provided. The semiconductor package includes a substrate; a semiconductor chip attached to a surface of the substrate; connecting conductors disposed on the surface of the substrate; a mold formed on the substrate and in which the connecting conductors and the semiconductor chip are provided; and connecting via holes extending through the mold and exposing the connecting conductors. With respect to a first connecting via hole of the connecting via holes, a planar distance between a first connecting conductor exposed by the first connecting via hole and an entrance of the first connecting via hole is not uniform.

14 Claims, 7 Drawing Sheets

SEMICONDUCTOR PACKAGE AND PACKAGE ON PACKAGE HAVING THE SAME

CROSS-REFERENCE TO RELATED APPLICATION

This application is a Continuation of U.S. application Ser. No. 13/244,506, filed on Sep. 25, 2011, now U.S. Pat. No. 8,531,032, which claims priority from Korean Patent Application No. 10-2010-0131508 filed on Dec. 21, 2010 in the Korean Intellectual Property Office, the contents of which in its entirety are herein incorporated by reference.

BACKGROUND

1. Field

Exemplary embodiments to a semiconductor package and a package on package having the same.

2. Description of the Related Art

Semiconductor packages are increasingly developed to meet requirements including multiple functions, high capacity, compactness, and small size. To keep pace with the development, a system in package (SIP) has been proposed, in which multiple semiconductor packages are integrated into one single semiconductor package, enabling high capacity and multiple functions while reducing the size of the semiconductor package.

One technology implemented in the SIP is to vertically stack semiconductor packages that are individually assembled and have undergone electric tests. This is referred to as a package on package (POP) or a stacked package.

In general, when an upper semiconductor package is stacked on a lower semiconductor package, a plurality of connecting conductors are used to electrically connect the lower semiconductor package and the upper semiconductor package. Here, a connecting conductor of the lower semiconductor package and a connecting conductor of the upper semiconductor package may be connected to each other through connecting via holes.

However, as semiconductor packages become smaller, a pitch between the connecting via holes gradually decreases. Accordingly, internal spaces of the connecting via holes are filled up by the connecting conductors of the upper and lower semiconductor packages, causing overflow, and short circuits between adjacent connecting conductors.

SUMMARY

One or more exemplary embodiments provide a semiconductor package which can prevent short circuit between adjacent connecting conductors.

One or more exemplary embodiments also provide a package on package which can prevent short circuit between adjacent connecting conductors.

According to an aspect of an exemplary embodiment, there is provided a semiconductor package including a substrate; a semiconductor chip attached to a surface of the substrate; a plurality of connecting conductors disposed on the surface of the substrate; a molding member formed on the substrate and in which the plurality of connecting conductors and the semiconductor chip are provided; and a plurality of connecting via holes extending through the molding member and exposing the plurality of connecting conductors, respectively, wherein with respect to a first connecting via hole of the plurality of connecting via holes, a planar distance between a first connecting conductor exposed by the first connecting via hole and an entrance of the first connecting via hole is not uniform.

According to another aspect of an exemplary embodiment, there is provided a semiconductor package including a substrate; a semiconductor chip attached to a surface of the substrate; a plurality of connecting conductors disposed on the surface of the substrate; a molding member formed on the substrate and having a space for the plurality of connecting conductors and the semiconductor chip; and a plurality of connecting via holes extending through the molding member and exposing the plurality of connecting conductors, respectively, wherein a center of a first connecting via hole among the plurality of connecting via holes is at a different position from a center of a corresponding first connecting conductor with respect to the substrate.

According to another aspect of an exemplary embodiment, there is provided a package on package including a first semiconductor package including a first substrate, a first semiconductor chip attached to a surface of the first substrate, a plurality of connecting conductors disposed on the surface of the first substrate, a molding member formed on the first substrate and having a space for the plurality of connecting conductors and the first semiconductor chip, and a plurality of connecting via holes extending through the molding member and exposing the plurality of connecting conductors, respectively; and a second semiconductor package including a second substrate and a second semiconductor chip attached to a surface of the second substrate and stacked on the first semiconductor package, wherein with respect to a first connecting via hole of the plurality of connecting via holes of the first semiconductor package, a planar distance between a first connecting conductor exposed by the first connecting via hole and an entrance of the first connecting via hole is not uniform.

According to another aspect of an exemplary embodiment, there is provided a semiconductor package, the semiconductor package including a substrate; a semiconductor chip attached to a surface of the substrate; a plurality of connecting conductors which provide connections to the semiconductor ship; and a mold formed on the substrate for holding the semiconductor chip and comprising a plurality of via holes which expose corresponding ones of the connecting conductors through the mold, wherein, for a first via hole of the plurality of via holes, a planar distance between a connecting conductor exposed by the first via hole and an entrance of the first via hole is not uniform.

BRIEF DESCRIPTION OF THE DRAWINGS

The above and other aspects will become more apparent by describing in detail exemplary embodiments with reference to the attached drawings in which.

DETAILED DESCRIPTION

Figure 1:
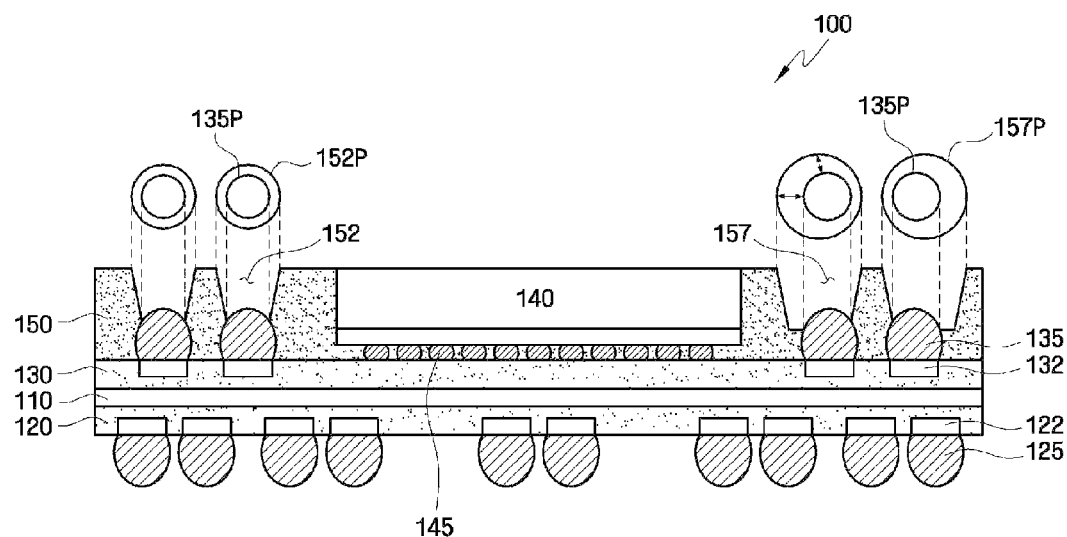
FIG. 1 is a cross-sectional view illustrating a semiconductor package according to an exemplary embodiment.

Advantages and features of the present inventive concept and methods of accomplishing the same may be understood more readily by reference to the following detailed description of exemplary embodiments and the accompanying drawings. The present inventive concept may, however, be embodied in many different forms and should not be construed as being limited to the exemplary embodiments set forth herein. Rather, these exemplary embodiments are provided so that this disclosure will be thorough and complete and will fully convey the present inventive concept to those skilled in the art, and the present inventive concept will only be defined by the appended claims. In the drawings, the thickness of layers and regions are exaggerated for clarity.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Like numbers refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Exemplary embodiments described herein will be described referring to plan views and/or cross-sectional views by way of ideal schematic views. Accordingly, the exemplary views may be modified depending on manufacturing technologies and/or tolerances. Therefore, the exemplary embodiments are not limited to those shown in the views, but include modifications in configuration formed on the basis of manufacturing processes. Therefore, regions exemplified in the figures have schematic properties, and shapes of regions shown in the figures exemplify specific shapes of regions of elements and not intended to limit aspects of the present inventive concept.

First, a semiconductor package according to an exemplary embodiment will be described. FIG. 1 is a cross-sectional view illustrating a semiconductor package according to an exemplary embodiment.

Referring to FIG. 1, the semiconductor package 100 includes a substrate 110, a semiconductor chip 140, a plurality of connecting conductors 135, molding member 150, and a plurality of connecting via holes 152 and 157.

The substrate 110 may be a board for a package, and may include, for example, a printed circuit board or a ceramic board. Further, as shown in FIG. 1, insulation layers 130 and 120 may be formed on top and bottom surfaces of the substrate 110, respectively. Pads 132 connected with the plurality of connecting conductors 135 may be formed on the insulation layer 130 formed on the top surface of the substrate 110. Pads 122 connected with a plurality of solder balls 125 may be formed on the insulation layer 120 formed on the bottom surface of the substrate 110.

The plurality of connecting conductors 135 may be connected to connecting conductors formed on the bottom surface of an upper semiconductor package when stacking the plurality of semiconductor packages, to then be electrically connected to the upper semiconductor package. In addition, the solder balls 125 may electrically connect the semiconductor packages to a module board or a main circuit board.

The semiconductor chip 140 may be attached to the top surface of the substrate 110. As illustrated, when the semiconductor chip 140 is referred to as being attached to the top surface of the substrate 110, it can be directly on or extend directly onto the insulation layer 130 formed on the substrate 110. For example, FIG. 1 shows the semiconductor chip 140 directly on the insulation layer 130. However, as just discussed, this is only an example. The semiconductor chip 140 may include, for example, a logic device such as a microprocessor, but is not limited thereto.

The semiconductor chip 140 may be stacked on the substrate 110 by, for example, a flip chip bonding process. Accordingly, the plurality of conductive chip bumps 145 are disposed between the substrate 110 and the semiconductor chip 140 to electrically connect the substrate 110 to the semiconductor chip 140. The plurality of conductive chip bumps 145 may be formed by, for example, a soldering process.

The plurality of connecting conductors 135 are disposed on the top surface of the substrate 110. The plurality of connecting conductors 135 may be formed of a solder material, and may have a substantially spherical or hemispherical shape.

The molding member 150 is formed on the substrate 110 and provides spaces for and structural support for the plurality of connecting conductors 135 and the semiconductor chip 140. More specifically, the molding member 150 may be formed on the top surface of the substrate 110 so as to surround lateral surfaces of the semiconductor chip 140 while filling a space between the semiconductor chip 140 and the substrate 110. Connecting via holes 152 and 157 to be described later may be formed in the molding member 150. The molding member 150 may include epoxy molding compound (EMC), polyimide, or the like.

FIG. 1 illustrates an exemplary embodiment in which the top surface of the semiconductor chip 140 is exposed because the molding member 150 has a height that is substantially the same as or less than the height of the semiconductor chip 140. That is to say, in a case where the top surface of the semiconductor chip 140 is exposed to the outside of the molding member 150, the overall thickness of the semiconductor package 100 and the overall thickness of a stacked package structure are reduced. In addition, various advantages are rendered, including an improved heat dissipation characteristic, increased resistance with respect to high-temperature processes, and increased resistance against twist. However, the present inventive concept does not limit the molding member 150 to that illustrated herein. Alternatively, the molding member 150 may be formed to extend beyond the height of the semiconductor chip 140 or to cover the semiconductor chip 140.

The plurality of connecting via holes 152 and 157 extend through the molding member 150 to expose the plurality of connecting conductors 135, respectively. The plurality of connecting via holes 152 and 157 may be formed by a laser drilling process using a laser. With respect to at least one of the plurality of connecting via holes 152 and 157, that is, a first connecting via hole 157, a planar distance from the first connecting conductor 135 exposed by the first connecting via hole 157 to an entrance of the first connecting via hole 157 is not uniform.

The term "planar distance from the first connecting conductor 135 to an entrance of the first connecting via hole 157" used herein may denote a distance from an outer contour line of the first connecting conductor 135 to an outer contour line of the first connecting via hole 157 when the semiconductor package is viewed from above, that is, in a plane view.

As shown in FIG. 1, distances from a planar outer contour line 157P of at least one of the plurality of connecting via holes 152 and 157, that is, the first connecting via hole 157, to a planar outer contour line 135P of the first connecting conductors 135 is not uniform, as shown on the right-hand side of FIG. 1.

By contrast, the planar outer contour line 152P of connecting via holes 152 disposed on the left-hand side in FIG. 1 are spaced a uniform distance apart from the planar outer contour line 135P of the connecting conductors 135. More specifically, as shown in FIG. 1, when the connecting conductors 135 are spherical or hemispherical, the entrance of the connecting via hole 152 exposing the connecting conductor 135 is also circular. Accordingly, the planar outer contour line 135P of the connecting conductor 135 and the planar outer contour line 152P of the connecting via hole 152 are both circular. In addition, the planar outer contour line 135P of the connecting conductor 135 and the planar outer contour line 152P of the connecting via hole 152 are concentrically formed.

On the other hand, returning to the examples on the right-hand side of FIG. 1, the planar outer contour line 157P of connecting via holes 157 disposed on the right-hand side in FIG. 1 are spaced a non-uniform distance apart from the planar outer contour line 135P of the first connecting conductors 135. Moreover, the centers of the planar outer contour line 135P of the first connecting conductor 135 and the planar outer contour line 157P of the first connecting via hole 157 may be at different positions from each other. In this case, as shown in the example on the right-hand side of FIG. 1, the planar outer contour line 135P of the first connecting conductor 135 and the planar outer contour line 157P of the first connecting via hole 157 may have the same shape, for example, a circular shape.

However, the planar outer contour line 135P of the first connecting conductors 135 and the planar outer contour line 157P of the first connecting via hole 157 may have different sizes. For example, planar shapes of the first connecting conductors 135 and the first connecting via hole 157 may both be real circle shapes. Here, the outer contour line 135P of the first connecting conductors 135 may be disposed within the outer contour line 157P of the first connecting via hole 157, or a portion of the outer contour line 135P of the first connecting conductors 135 may protrude outside the outer contour line 157P of the first connecting via hole 157.

In some other exemplary embodiments, the planar outer contour line 135P of the first connecting conductors 135 and the planar outer contour line 157P of the first connecting via hole 157 may have different shapes and different sizes. In such cases, for example, the planar shape of the first connecting conductors 135 may be a real circle shape, and the planar shape of the first connecting via hole 157 may be an oval shape. Likewise the outer contour line 135P of the first connecting conductors 135 may be disposed within the outer contour line 157P of the first connecting via hole 157, or a portion of the outer contour line 135P of the first connecting conductors 135 may protrude outside the planar outer contour line 157P of the first connecting via hole 157.

That is to say, as shown in the right side of FIG. 1, with respect to one of the first connecting conductors 135, a distance between the planar outer contour line 135P of the first connecting conductor 135 and the planar outer contour line 157P of the first connecting via hole 157 is not uniform. In this case, the center of the first connecting conductor 135 and the center of the first connecting via hole 157 may be positioned at different positions. Accordingly, the center of the planar outer contour line 135P of the first connecting conductor 135 and the center of the planar outer contour line 157P of the first connecting via hole 157 might not be concentric in some cases.

In other words, the center of at least one first connecting via hole 157 of the plurality of connecting via holes 152 and 157 may be positioned at a position different from that of the first connecting conductors 135 that are exposed by the first connecting via hole 157. As described above, the center of the first connecting conductors 135 and the center of the first connecting via hole 157 may denote the center of the planar outer contour line 135P of the first connecting conductor 135 and the center of the planar outer contour line 157P of the first connecting via hole 157, respectively.

Further, in some other exemplary embodiments, the center of the first connecting conductor 135 and the center of the first connecting via hole 157 may be positioned at the same position. In this case, a distance between the planar outer contour line 135P of the first connecting conductor 135 and the planar outer contour line 157P of the first connecting via hole 157 is still not uniform. For example, a planar shape of the first connecting conductor 135 may be a real circle shape, and a planar shape of the first connecting via hole 157 may be an oval shape while still having the same center.

In the semiconductor package according to exemplary embodiments, the first connecting via hole 157 exposing the first connecting conductor 135 may be formed in various shapes to prevent a connecting conductor disposed within the first connecting via hole 157 from outflowing from the first connecting via hole 157 and contacting an adjacent connecting conductor. In other words, a space can be formed within the first connecting via hole 157 in which the connecting conductor is disposed by varying arrangement relationships between the first connecting via hole 157 and the first connecting conductor 135, that is, planar shapes, center positions, a distance between outer contour lines, etc. Further, in a case of using laser drilling when a connecting via hole is formed, the connecting via hole having various shapes can be more easily formed.

Figure 2A:
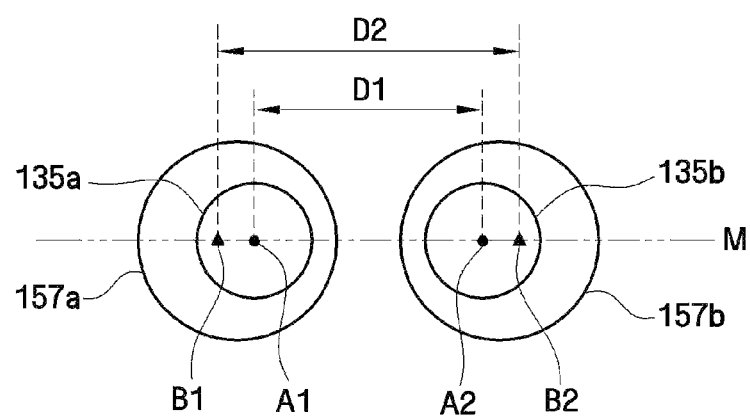
FIGS. 2A to 2C are plan views illustrating different arrangements of a first connecting via hole relative to a first connecting conductor according to exemplary embodiments.
Figure 2B:
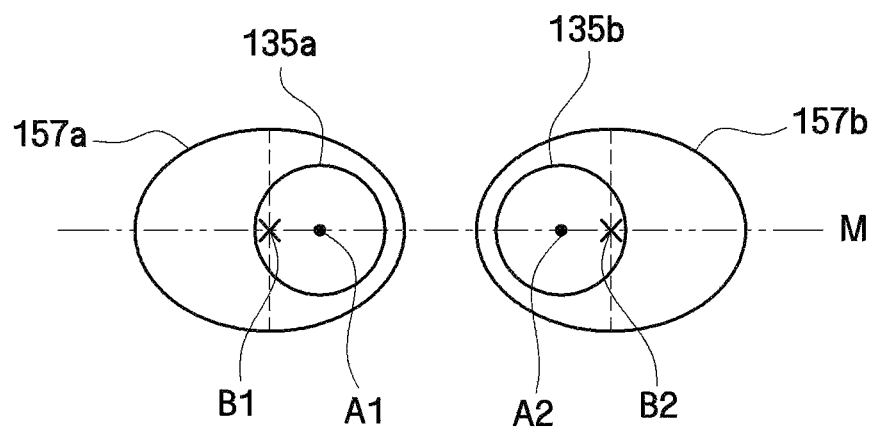
Figure 2C:
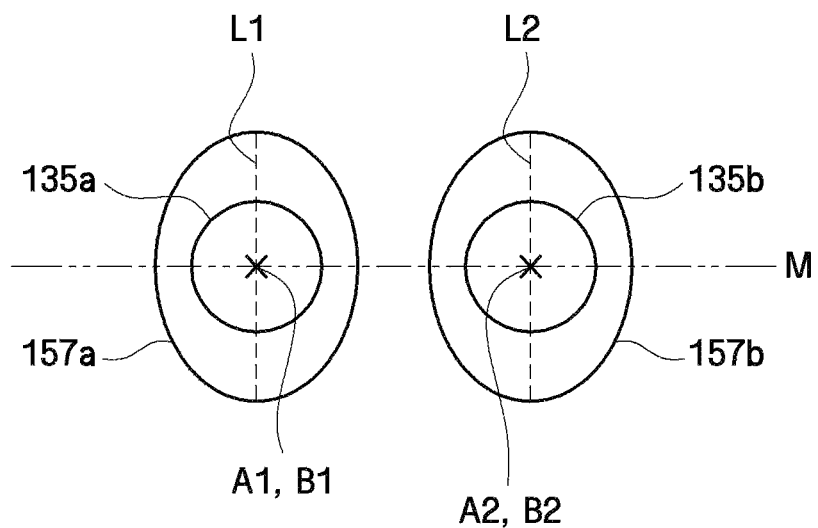
Figure 3A:
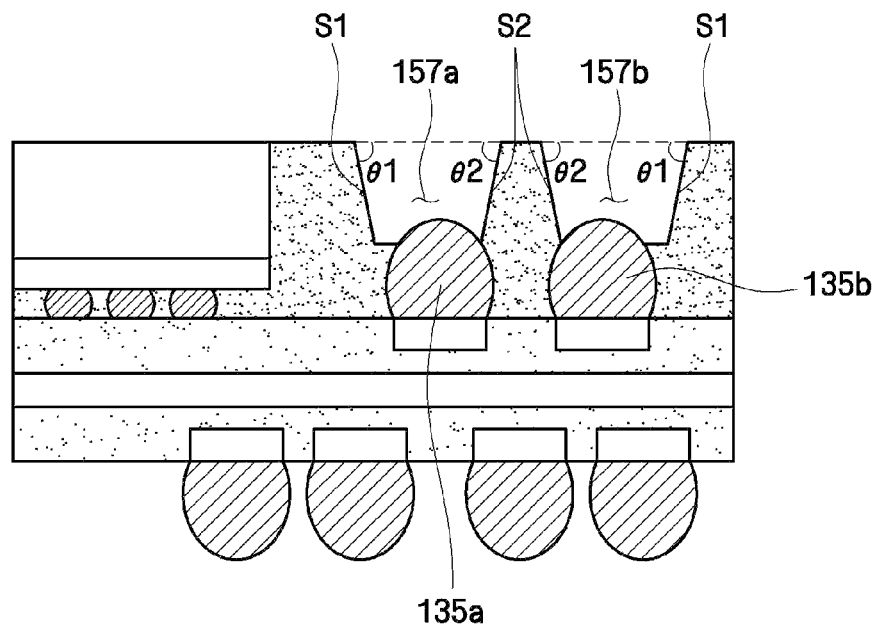
FIGS. 3A to 3C are cross-sectional views illustrating variously shaped sidewalls of the first connecting via hole according to exemplary embodiments.
Figure 3B:
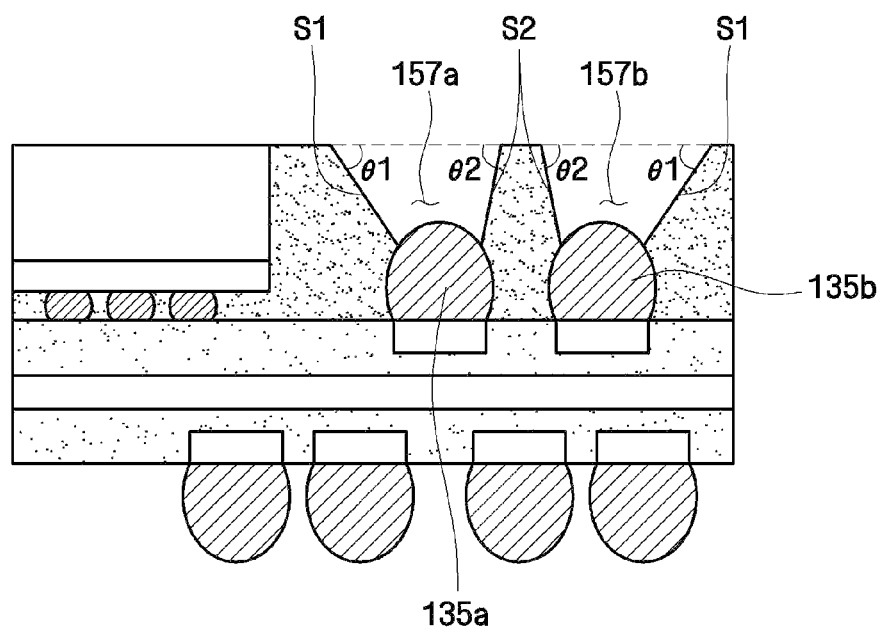
Figure 3C:
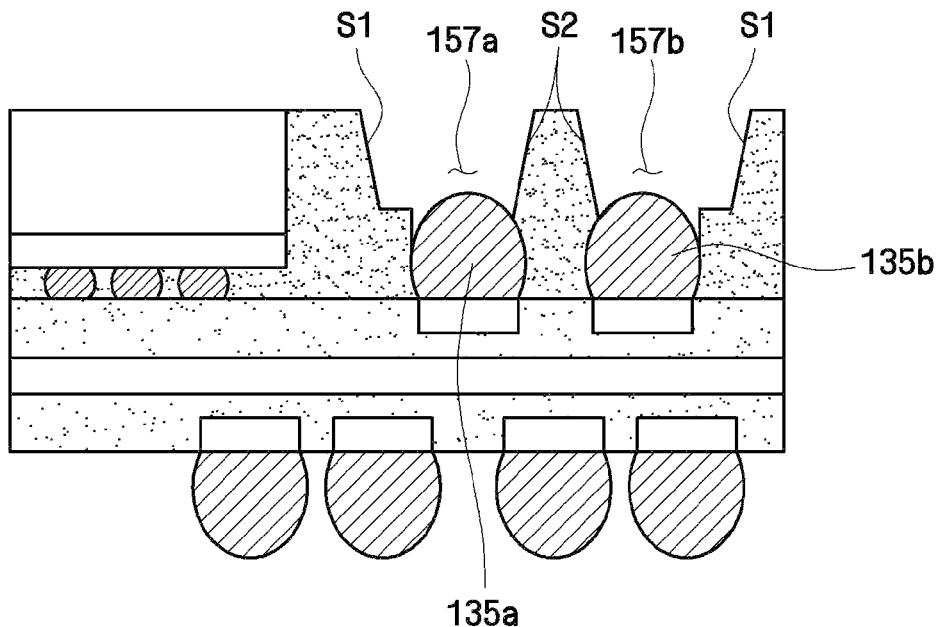

Hereinafter, various arrangements of the first and second connecting via holes relative to first and second connecting conductors, respectively, will be described with reference to FIGS. 2A to 2C and FIGS. 3A to 3C. FIGS. 2A to 2C are plan views illustrating arrangement of a first connecting via hole relative to a first connecting conductor, and FIGS. 3A to 3C are cross-sectional views illustrating variously shaped sidewalls of the first connecting via hole.

The plurality of connecting conductors may include a first connecting conductor 135a and a second connecting conductor 135b disposed in adjacent with each other, and a plurality of connecting via holes may include a first connecting via hole 157a exposing the first connecting conductor 135a and a second connecting via hole 157b exposing the second connecting conductor 135b.

As shown in FIG. 2A, the center A1 of the first connecting conductor 135a and the center B1 of the first connecting via hole 157a may be positioned at different positions. In addition, the center A2 of the second connecting conductor 157a and the center B2 of the second connecting via hole 157b may also be positioned at different positions. Alternatively, assuming that a distance between the center A1 of the first connecting conductor 135a and the center A2 of the second connecting conductor 135b is denoted as a first distance D1 and a distance between the center B1 of the first connecting via hole 157b and the center B2 of the second connecting via hole 157b is denoted as a second distance D2, the second distance D2 may be greater than the first distance D1.

Accordingly, a planar distance between the first connecting via hole 157a and the first connecting conductor 135a is reduced as outer contour lines of the first connecting via hole 157a and the first connecting conductor 135a become closer to the second connecting conductor 135b. In addition, a planar distance between the first connecting via hole 157a and the first connecting conductor 135a is increased as outer contour lines of the first connecting via hole 157a and the first connecting conductor 135a become farther from the second connecting conductor 135b. In other words, an internal space of the molding member 150 provided by the first connecting via hole 157a and the second connecting via hole 157b is small in a region where the first connecting conductor 135a and the second connecting conductor 135b are adjacent to each other, and the internal space of the molding member 150 provided by the first connecting via hole 157a and the second connecting via hole 157b is large in a region where the first connecting conductor 135a and the second connecting conductor 135b are spaced apart from each other, making the internal space serve as a kind of buffer space.

Accordingly, when the connecting conductors of the upper semiconductor package are connected to the first connecting conductor 135a and the second connecting conductor 135b, they may extend toward the relatively wide space to the outside of the first and second connecting conductors 135a, 135b as shown in FIG. 2A, that is, to a region where the first connecting conductor 135a and the second connecting conductor 135b are spaced apart from each other, thereby preventing a short circuit between adjacent connecting conductors.

As shown, planar shapes of the first connecting conductor 135a and the second connecting conductor 135b may be the same as those of the first connecting via hole 157a and the second connecting via hole 157b, while sizes of the first connecting conductor 135a and the second connecting conductor 135b may be different from those of the first connecting via hole 157a and the second connecting via hole 157b. For example, the first and second connecting conductor 135a and 135b and the first and second connecting via holes 157a and 157b in FIG. 2A are all formed in real circle shapes, and sizes, e.g., diameters, of the real circle shapes of the first connecting via hole 157a and the second connecting via hole 157b may be larger than sizes, e.g., diameters, of the first connecting conductor 135a and the second connecting conductor 135b. Accordingly, when the first connecting conductor 135a and the second connecting conductor 135b are disposed within the first connecting via hole 157a and the second connecting via hole 157b, respectively, a sufficient large buffer region for connecting the connecting conductors of the upper semiconductor package can be secured. Therefore, a short circuit between adjacent connecting conductors can be prevented.

FIG. 2A illustrates that the centers of the first connecting conductor 135a and the second connecting conductor 135b which are adjacent to each other are positioned at different positions from the centers of the first connecting via hole 157a and the second connecting via hole 157b. However, in some other exemplary embodiments, the center of at least one of the first connecting conductor 135a and the second connecting conductor 135b, for example, the center A1 of the first connecting conductor 135a, and the center B1 of the first connecting via hole 157a are disposed at different positions, and the center A2 of the second connecting conductor 135b and the center B2 of the second connecting via hole 157b may be positioned at the same position.

Referring FIG. 2B, the center A1 of the first connecting conductor 135a and the center B1 of the first connecting via hole 157a are still disposed at different positions from the center A2 of the second connecting conductor 135b and the center B2 of the second connecting via hole 157b.

Likewise, assuming that a distance between the center A1 of the first connecting conductor 135a and the center A2 of the second connecting conductor 135b is denoted as a first distance D1 and a distance between the center B1 of the first connecting via hole 157b and the center B2 of the second connecting via hole 157b is denoted as a second distance D2, the second distance D2 may be greater than the first distance D1.

However, as shown in FIG. 2B, a planar shape of the first connecting conductor 135a and the second connecting conductor 135b and a planar shape of first connecting via hole 157a and the second connecting via hole 157b may be different from each other. For example, the planar shapes of the first connecting conductor 135a and the second connecting conductor 135b may be real circle shapes while the planar shapes of the first connecting via hole 157a and the second connecting via hole 157b may be oval shapes.

As described above, since the first connecting via hole 157a and the second connecting via hole 157b extending through the molding member 150 are formed to have different planar shapes as those of the first connecting conductor 135a and the second connecting conductor 135b, a sufficiently large buffer region for connecting conductors of the upper semiconductor package can be secured on the first connecting conductor 135a and the second connecting conductor 135b disposed within the first connecting via hole 157a and the second connecting via hole 157b, respectively. Therefore, a short circuit between adjacent connecting conductors can be prevented.

Further, FIG. 2B illustrates that the centers of the first connecting conductor 135a and the second connecting conductor 135b are both disposed at different positions from the centers of the first connecting via hole 157a and the second connecting via hole 157b, respectively. However, in some other exemplary embodiments, the center of at least one of the first connecting conductor 135a and the second connecting conductor 135b disposed adjacent to each other, for example, the center A1 of the first connecting conductor 135a may be positioned at a position different from the center B1 of the first connecting via hole 157a, and the center A2 of the second connecting conductor 135b may be positioned at the same position as the center B2 of the second connecting via hole 157b.

Referring to FIG. 2C, the center A1 of the first connecting conductor 135a and the center B1 of the first connecting via hole 157a may be positioned at the same position. In addition, the center A2 of the second connecting conductor 135b and the center B2 of the second connecting via hole 157b may also be positioned at the same position. Here, similar to the case described above, a planar distance from the first and second connecting conductors 135a and 135b to entrances of the first and second connecting via holes 157a and 157b, respectively, may not be uniform. The first and second connecting conductors 135a and 135b may have different shapes from those of the first and second connecting via holes 157a and 157b, respectively. For example, planar shapes of the first and second connecting conductors 135a and 135b may be real circle shapes, and planar shapes of the first and second connecting via holes 157a and 157b may be oval shapes.

As described above, a sufficiently large buffer region for connecting the connecting conductors of the upper semiconductor package can be secured on the first connecting conductor 135a and the second connecting conductor 135b disposed within the first connecting via hole 157a and the second connecting via hole 157b, respectively, extending through the molding member 150 by forming the first connecting via hole 157a and the second connecting via hole 157b to have different planar shapes as those of the first connecting conductor 135a and the second connecting conductor 135b, respectively.

Therefore, a short circuit between adjacent connecting conductors can be prevented.

As shown in FIGS. 2B and 2C, when the first connecting via hole 157a and the second connecting via hole 157b are formed to have planarly oval shapes, the planar shape of each of the connecting via holes 157a and 157b may have a long axis and a short axis. Here, the long axis denotes a line connecting two focuses of the oval, and the short axis denotes a line perpendicular to the line connecting two focuses of the oval.

As shown in FIG. 2B, the long axes of the first connecting via hole 157a and the second connecting via hole 157b may be disposed on a line M connecting the center A1 of the first connecting conductor 135a and the center A2 of the second connecting conductor 135b. As shown in FIG. 2C, alternatively, the long axes of the first connecting via hole 157a and the second connecting via hole 157b may be disposed perpendicular to the center line M connecting the center A1 of the first connecting conductor 135a and the center A2 of the second connecting conductor 135b.

When the first connecting via hole 157a and the second connecting via hole 157b are formed in planarly oval shapes, the long axis of each of the connecting via holes 157a and 157b may be arranged in various manners relative to the center line M. However, when the center B1 of the first connecting via hole 157a and the center A1 of the first connecting conductor 135a are disposed at the same position, the long axis of the first connecting via hole 157a is at an angle other than 0 degrees with respect to the center line M.

Further, although FIGS. 2A to 2C illustrate the first and second connecting conductors 135a and 135b and the first and second connecting via holes 157a and 157b are arranged perpendicular to the center line M and symmetrical to the line passing the mid point of the center A1 of the first connecting conductor 135a and the center A2 of the second connecting conductor 135b, the present inventive concept is not limited thereto. For example, the planar shape and the center position of the first connecting via hole 157a may be different from those of the second connecting via hole 157b.

Referring to FIGS. 3A to 3C, first and second sidewalls S1 and S2 of the first and second connecting via holes 157a and 157b may have different shapes.

More specifically, the first connecting via hole 157a and the second connecting via hole 157b may each have a first sidewall S1 and a second sidewall S2 defined as surfaces of the molding member 150. In addition, as shown in FIGS. 3A and 3B, the first sidewall S1 and the second sidewall S2 of the first and second connecting via holes 157a and 157b may have a first slope θ1 and a second slope θ2, respectively, with respect to the surface of the molding member. That is, the first sidewall S1 of the first connecting via hole 157a may have a first slope θ1, and the second sidewall S2 of the first connecting via hole 157b may have a second slope θ2, and the first sidewall S1 of the second connecting via hole 157b may have the first slope θ1, and the second sidewall S2 of the second connecting via hole 157b may have the second slope θ2.

As shown in FIG. 3A, the first slope θ1 and the second slope θ2 of the first connecting via hole 157a may be the same with each other. The second connecting via hole 157b may have a first sidewall S1 and a second sidewall S2 having the same slope.

However, the first sidewall S1 opposite to the second sidewall S2 at which the first connecting conductor 135a and the second connecting conductor 135b are disposed may be farther from the first connecting conductor 135a and the second connecting conductor 135b than the second sidewall S2.

As shown in FIG. 3B, with respect to the first connecting via hole 157a and the second connecting via hole 157b exposing the first connecting conductor 135a and the second connecting conductor 135b disposed adjacent to each other, the first slope θ1 of the first sidewall S1 and the second slope θ2 of the second sidewall S2 of each connecting via hole may be different from each other.

More specifically, the second sidewalls S2 of the first connecting via hole 157a and the second connecting via hole 157b are closer to each other than the first sidewalls S1 of the first connecting via hole 157a and the second connecting via hole 157b. The second slope θ2 of the first connecting via hole 157a is larger than the first slope θ1 of the first connecting via hole 157a and the second slope θ2 of the second connecting via hole 157b is larger than the first slope θ1 of the second connecting via hole 157b.

In addition, as shown in FIG. 3C, at least one of the first sidewall S1 and the second sidewall S2 of at least one of the first connecting via hole 157a and the second connecting via hole 157b may be formed stepwise. FIG. 3C illustrates the second sidewall S2 of the first connecting via hole 157a and the second sidewall S2 of the second connecting via hole 157b are formed in a tilted manner, and the first sidewalls S1 of the first connecting via hole 157a and the second connecting via hole 157b opposite to the second sidewalls S2 are formed stepwise. However, FIG. 3C illustrates only an exemplary embodiment, and alternative embodiments may also be made. That is to say, at least one of the first sidewall S1 and the second sidewall S2 of the first connecting via hole 157a and at least one of the first sidewall S1 and the second sidewall S2 of the second connecting via hole 157b may be formed stepwise. Alternatively, in addition to the exemplary embodiments shown in FIGS. 3A to 3C, the variously shaped sidewalls capable of providing a buffer region in a connecting via hole may be implemented. In addition, in a case of forming a connecting via hole using laser drilling, connecting via holes having various shapes can be easily formed.

Alternatively, the above-described exemplary embodiments shown in FIGS. 2A to 2C and FIGS. 3A to 3C can be combined in various manners. For example, by combining the exemplary embodiments shown in FIGS. 2A and 3C, at least one of sidewalls may be formed stepwise while forming connecting conductors and connecting via holes in planarly real circle shapes. Additionally, one of ordinary skill in the art will understand that a variety of combinations may be made, and detailed explanations of the respective combinations will not be given for the sake of brevity and convenient description.

Figure 4:
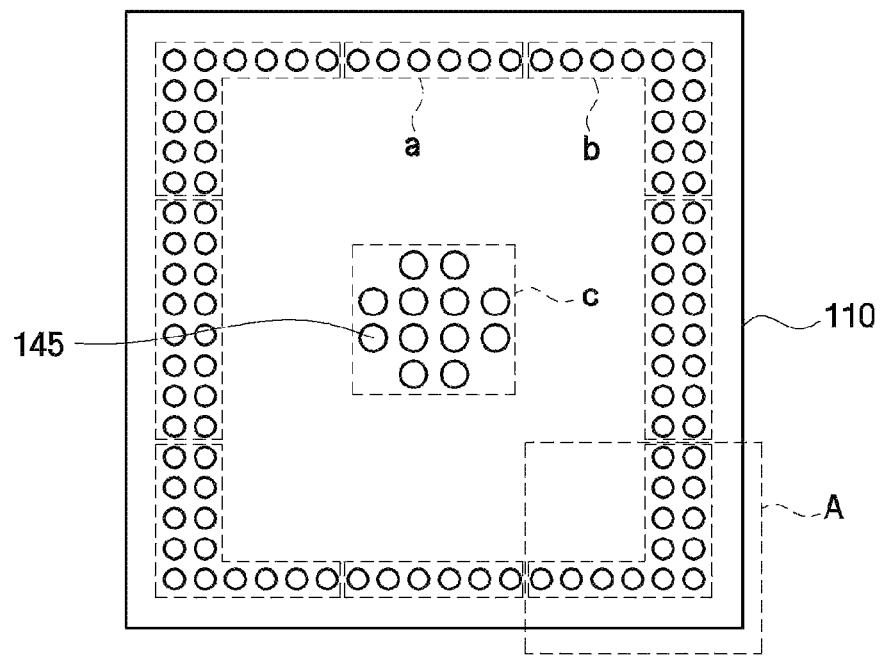
FIG. 4 is a view illustrating that a connecting conductor region to define a plurality of connecting conductors arranged on a substrate according to an exemplary embodiment.

Further, arrangement relationships between a plurality of connecting conductors 135 disposed on a substrate 110 and a plurality of connecting via holes 152 and 157 will be described with reference to FIGS. 4 and 5. FIG. 4 is a view illustrating a connecting conductor region to define a plurality of connecting conductors arranged on a substrate, and FIG. 5 is a partially enlarged view of an 'A' portion of FIG. 4.

As shown in FIG. 4, the substrate 110 includes connecting conductor regions a and b in which the plurality of connecting conductors 135 are arranged, the connecting conductor regions a and b corresponding to sides of the substrate 110 and corners of the substrate 110, respectively. While FIG. 4 illustrates that the connecting conductors 135 are arranged in a row in the first region a, they may also be arranged in a plurality of rows, or in a non-uniform arrangement.

Figure 5:
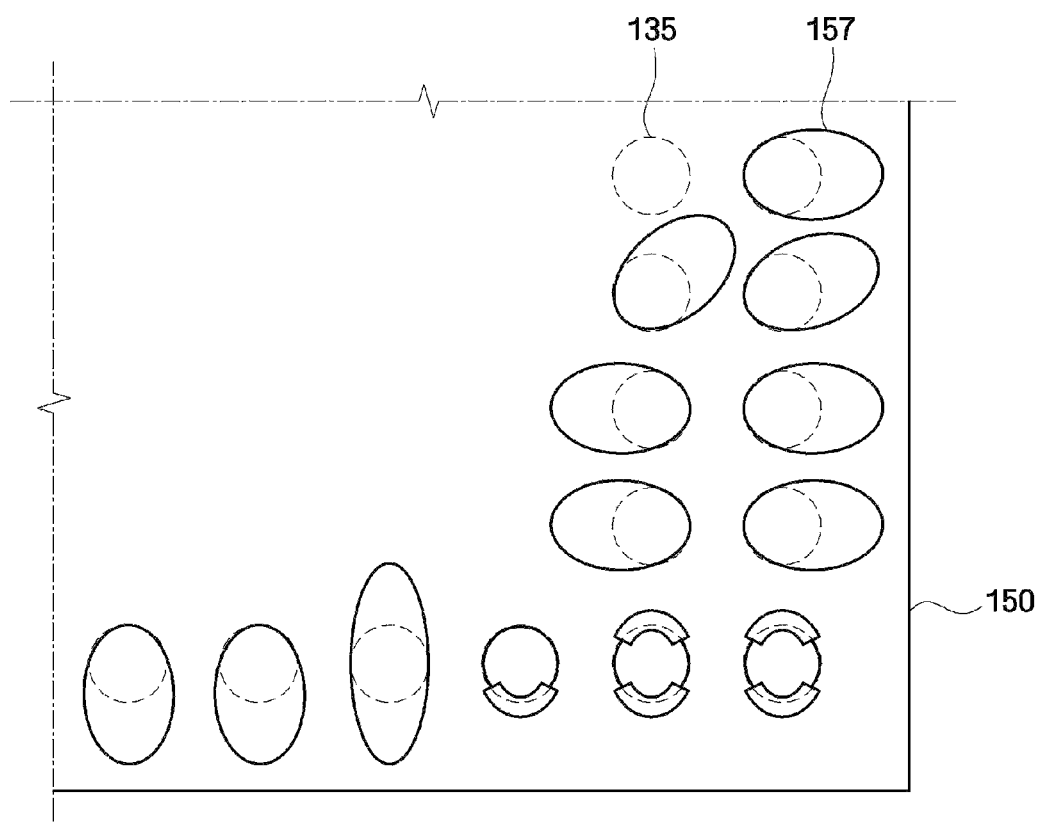
FIG. 5 is a partially enlarged view of an 'A' portion of FIG. 4.

As shown in FIG. 5, among the plurality of connecting conductors 135, a group of connecting conductors arranged in the second region b may be exposed according to the first connecting via hole 157. More specifically, planar distances from the connecting conductors 135 arranged in the second region b to entrances of the corresponding connecting via holes 157 are not uniform. Alternatively, centers of the connecting conductors 135 arranged in the second region b may be different from the centers of the corresponding connecting via holes 157. Alternatively, centers of the connecting conductors 135 arranged in the second region b may have different planar shapes from those of centers of the corresponding connecting via holes 157 while being at the same positions as the center of the corresponding connecting via holes 157. Here, planar distances from the connecting conductors 135 arranged in the second region a to entrances of connecting via holes 152 may be uniform.

As described above, enough space other than a space in which connecting conductors of an upper semiconductor package are connected on the region where the connecting conductors 135 are disposed can be formed by varying planar shapes of the first connecting via hole 157 exposing the connecting conductors 135 in corner regions. Accordingly, a short circuit between adjacent connecting conductors, which frequently occurs at a corner region, can be prevented.

Further, in a case of using laser drilling when the connecting via holes 157 are formed, the connecting via holes 157 having various shapes can be more easily formed, thereby reducing processing burdens.

Alternatively, the connecting via holes 157 having various shapes can be employed in both the connecting conductor regions a and b where the plurality of connecting conductors 135 are disposed as well as the corner region. That is to say, the connecting conductors 135 disposed in the first region a and the second region b may be exposed by the connecting via holes 157 having various shapes. In other words, with respect to the connecting conductors 135 disposed on the connecting conductor regions a and b, a planar distance from the contour line of the connecting conductors 135 to the contour line of the contour line of the connecting via holes 157 may be made such that they are not uniform.

Figure 6:
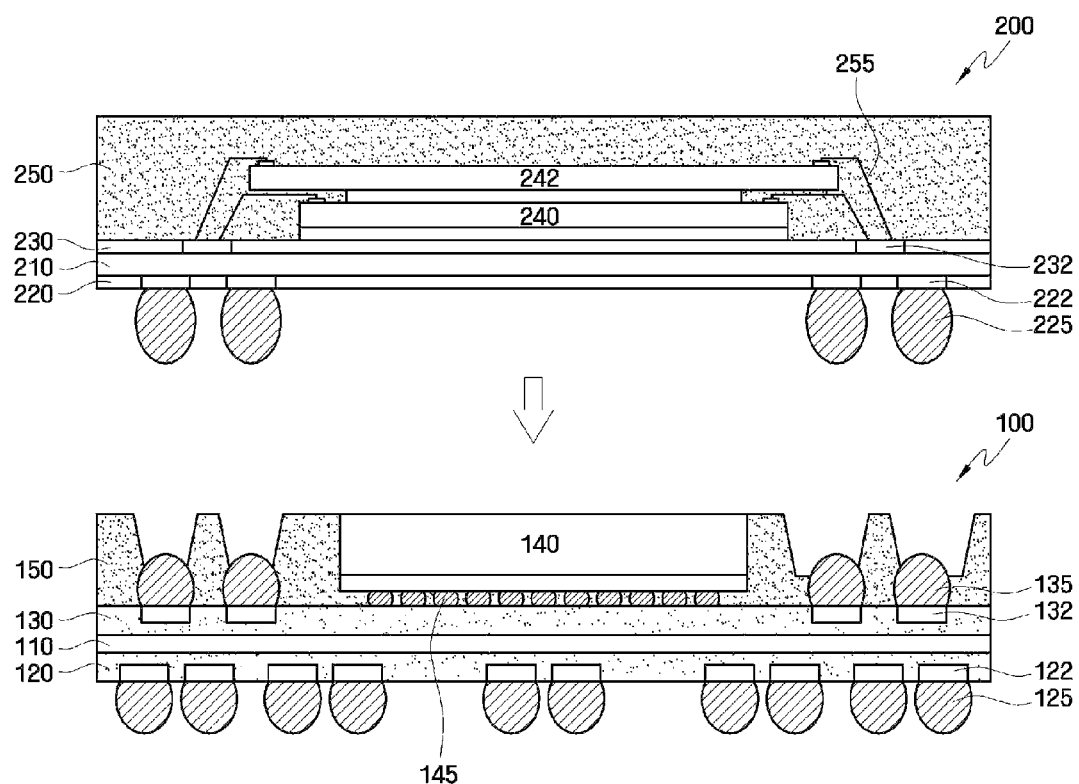
FIG. 6 is a view illustrating a process of stacking an upper semiconductor package on a semiconductor package according to an exemplary embodiment.
Figure 7:
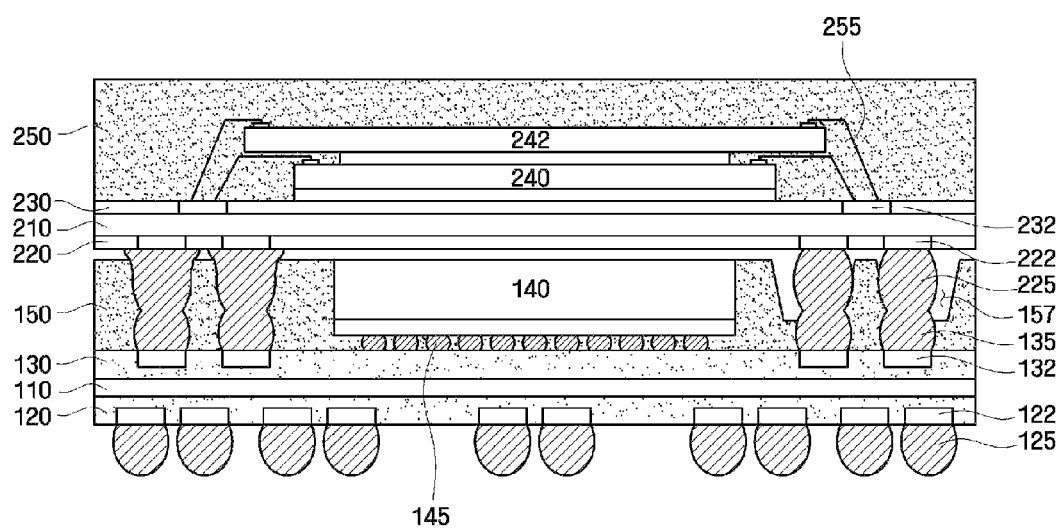
FIG. 7 is a cross-sectional view illustrating a package on package having an upper semiconductor package stacked on a semiconductor package according to an exemplary embodiment.

Hereinafter, a package on package according to an exemplary embodiment will be described with reference to FIGS. 6 and 7. FIG. 6 is a view illustrating a process of stacking an upper semiconductor package on a semiconductor package according to an exemplary embodiment, and FIG. 7 is a cross-sectional view illustrating a package on package having an upper semiconductor package stacked on a semiconductor package according to an exemplary embodiment. Here, since the first semiconductor package 100 shown in FIGS. 6 and 7 has the same configuration as the semiconductor packages according to the above-described exemplary embodiments, a detailed description thereof will be omitted.

Referring to FIGS. 6 and 7, the package on package includes a first semiconductor package 100 and a second semiconductor package 200. Here, the first semiconductor package 100 may be referred to as a lower semiconductor package and the second semiconductor package 200 may be referred to as an upper semiconductor package.

More specifically, the first semiconductor package 100 includes a first substrate 110, a first semiconductor chip 140 attached to a top surface of the first substrate 110, a plurality of connecting conductors 135 disposed on the top surface of the first substrate 110, a molding member 150 formed on the first substrate 110 to provide space and structural support for the plurality of connecting conductors 135 and the first semiconductor chip 140, and a plurality of connecting via holes 152 and 157 extending through the molding member 150 to expose the plurality of connecting conductors 135, respectively. The second semiconductor package 200 includes a second substrate 210, and a second semiconductor chip 240 attached to a top surface of the second substrate 210. The second semiconductor package 200 is stacked on the first semiconductor package 100.

Here, a planar distance from a first connecting conductor 135 exposed by at least one of the plurality of connecting via holes 152 and 157, that is, a first connecting via hole 157, of the first semiconductor package 100, to an entrance of the first connecting via hole 157, is not uniform.

That is, the semiconductor package 100 according to the exemplary embodiment may be applied to the lower semiconductor package 100 of the package on package shown in FIGS. 6 and 7. For example, the connecting via holes 157 shown in FIGS. 2A to 2C and FIGS. 3A to 3C may be applied to at least one of the plurality of connecting via holes 152 and 157 of the lower semiconductor package 100.

Accordingly, at least one of the connecting via holes 152 and 157 exposing the connecting conductors 135 of the lower semiconductor package 100, that is, the first connecting via hole 157, may include a buffer space for connecting conductors 225 of the upper semiconductor package 200. Therefore, even if the connecting conductors 135 of the lower semiconductor package 100 are connected to the connecting conductor 225 of the upper semiconductor package 200, it is possible to prevent the first connecting via hole 157 from outflowing.

That is to say, it is possible to prevent a short circuit from occurring between adjacent connecting conductors 135 when the upper semiconductor package 200 is stacked on the lower semiconductor package 100. Accordingly, reliability of the package on package can be further improved.

While exemplary embodiments been particularly shown and described, it will be understood by those of ordinary skill in the art that various changes in form and details may be made therein without departing from the spirit and scope of the present inventive concept as defined by the following claims. It is therefore desired that the exemplary embodiments be considered in all respects as illustrative and not restrictive, reference being made to the appended claims rather than the foregoing description to indicate the scope of the present inventive concept.

What is claimed is:

1. A semiconductor package comprising:
   a substrate;
   a semiconductor chip attached to a surface of the substrate;
   a plurality of connecting conductors; and
   a mold formed on the substrate for holding the semiconductor chip and comprising a plurality of via holes which expose corresponding ones of the connecting conductors through the mold, wherein, for a first via hole of the plurality of via holes, a planar distance between a connecting conductor exposed by the first via hole and an entrance of the first via hole is not uniform.

2. The semiconductor package of claim 1, wherein, for a second via hole of the plurality of via holes, a planar distance between a connecting conductor exposed by the second via hole and an entrance to the second via hole is uniform.

3. The semiconductor package of claim 1, wherein a center of the connecting conductor exposed by the first via hole is offset from a center of the first via hole.

4. The semiconductor package of claim 3, wherein a planar shape of the connecting conductor exposed by the first via hole is different than a planar shape of the first via hole.

5. The semiconductor package of claim 1, wherein a planar shape of the connecting conductor exposed by the first via hole is different than a planar shape of the first via hole.

6. A semiconductor package comprising:
a substrate;
a semiconductor chip attached to a surface of the substrate;
a connecting conductor disposed on the surface of the substrate;
a molding member formed on the substrate and in which the connecting conductor and the semiconductor chip are provided; and
a via hole extending through the molding member and exposing the connecting conductor,
wherein the connecting conductor is disposed in the via hole that is formed in an outermost area of the molding member, from a cross-sectional view the connecting conductor contacts the molding member at a first point and a second point,
wherein a first distance between the first point and an entrance of the via hole near the first point is greater than a second distance between the second point and an entrance of the via hole near the second point.

7. The semiconductor package of claim 6, wherein a first slope of a first side of the via hole formed between the first point and an entrance of the via hole near the first point is smaller than a second slope of a second side of the via hole formed between the second point and an entrance of the via hole near the second point.

8. The semiconductor package of claim 6, wherein a center of the connecting conductor exposed by the via hole is offset from a center of the via hole.

9. A semiconductor package comprising:
a substrate;
a semiconductor chip attached to a surface of the substrate;
a connecting conductor disposed on the surface of the substrate;
a molding member formed on the substrate and in which the connecting conductor and the semiconductor chip are provided; and
a via hole extending through the molding member and exposing the connecting conductor,
wherein the connecting conductor is disposed in the via hole that is formed in an outermost area of the molding member, from a cross-sectional view the connecting conductor contacts the molding member at a first point and a second point,
wherein a first side of the via hole formed between the first point and an entrance of the via hole near the first point has a different slope from a second side of the via hole formed between the second point and an entrance of the via hole near the second point.

10. The semiconductor package of claim 9, wherein a planar shape of the connecting conductor and a planar shape of the via hole are both a real circle shape.

11. The semiconductor package of claim 9, wherein a planar shape of the connecting conductor is a real circle shape, and a planar shape of the via hole is an oval shape.

12. A package on package comprising:
a first semiconductor package including a first substrate, a first semiconductor chip attached to a surface of the first substrate, a connecting conductor disposed on the surface of the first substrate, a molding member formed on the first substrate and having a space for the connecting conductor and the first semiconductor chip, and a via hole extending through the molding member and exposing the connecting conductor; and
a second semiconductor package including a second substrate and a second semiconductor chip attached to a surface of the second substrate and stacked on the first semiconductor package,
wherein the connecting conductor is disposed in the via hole that is formed in an outermost area of the molding member, from a cross-sectional view the connecting conductor contacts the molding member at a first point and a second point,
wherein a first distance between the first point and an entrance of the via hole near the first point is greater than a second distance between the second point and an entrance of the via hole near the second point.

13. The package on package of claim 12, wherein a first slope of a first side of the via hole formed between the first point and an entrance of the via hole near the first point is different from a second slope of a second side of the via hole formed between the second point and an entrance of the via hole near the second point.

14. The package on package of claim 13, wherein the second slope is greater than the first slope.

* * * * *